(12) United States Patent
Chen et al.

(10) Patent No.: US 9,680,077 B1
(45) Date of Patent: Jun. 13, 2017

(54) LIGHT-EMITTING DIODE LIGHTING DEVICE

(71) Applicant: MIKRO MESA TECHNOLOGY CO., LTD., Apia (WS)

(72) Inventors: Li-Yi Chen, Tainan (TW); Chih-Hui Chan, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/215,565

(22) Filed: Jul. 20, 2016

(51) Int. Cl.
| | |
|---|---|
| H01L 33/60 | (2010.01) |
| H01L 33/44 | (2010.01) |
| H01L 33/38 | (2010.01) |
| H01L 33/08 | (2010.01) |
| H01L 33/54 | (2010.01) |
| H01L 33/50 | (2010.01) |
| H01L 33/56 | (2010.01) |

(52) U.S. Cl.
CPC ............ *H01L 33/60* (2013.01); *H01L 33/08* (2013.01); *H01L 33/38* (2013.01); *H01L 33/44* (2013.01); *H01L 33/502* (2013.01); *H01L 33/54* (2013.01); *H01L 33/56* (2013.01)

(58) Field of Classification Search
None
See application file for complete search history.

(56) References Cited

U.S. PATENT DOCUMENTS

| | | | |
|---|---|---|---|
| 6,992,334 B1 | 1/2006 | Wierer, Jr. et al. | |
| 8,242,518 B2 * | 8/2012 | Lerman | H01L 25/0753 257/100 |
| 8,502,239 B2 | 8/2013 | Liu | |
| 2006/0017372 A1 | 1/2006 | Chu et al. | |
| 2008/0179602 A1 | 7/2008 | Negley et al. | |
| 2010/0237381 A1 | 9/2010 | Kamiya | |
| 2010/0291374 A1 | 11/2010 | Akarsu et al. | |
| 2011/0193105 A1 | 8/2011 | Lerman et al. | |
| 2013/0264592 A1 | 10/2013 | Bergmann et al. | |
| 2015/0115293 A1 * | 4/2015 | Wu | H01L 27/156 257/88 |

* cited by examiner

*Primary Examiner* — Michelle Mandala
(74) *Attorney, Agent, or Firm* — CKC & Partners Co., Ltd.

(57) ABSTRACT

A light-emitting diode (LED) lighting device includes a substrate, an isolation layer, a first bottom electrode, a second bottom electrode, at least one first vertical LED, a first conductive bonding layer, at least one second vertical LED, a second conductive bonding layer, a first transparent sealing material, a second transparent sealing material, and a top electrode. The substrate has a base portion and a plurality of protruding portions present on the base portion. The base portion and the protruding portions cooperate to define at least one first recess and at least one second recess. At least one of the first recess and the second recess has a bottom surface and at least one sidewall adjacent to the bottom surface. The bottom surface and the sidewall are reflective. The first vertical LED and the second vertical LED are electrically connected in series.

19 Claims, 10 Drawing Sheets

LIGHT-EMITTING DIODE LIGHTING DEVICE

BACKGROUND

Technical Field

The present disclosure relates to a light-emitting diode lighting device.

Description of Related Art

In recent years, light-emitting diode (LED) technologies have improved a lot, and LEDs with high power and high brightness have been presented to the market. In addition, the LEDs used as light bulbs have the advantage of long lifetime. Therefore, such LED light bulbs have the tendency to replace other conventional light sources. LEDs can be applied to various types of lamps, such as traffic lights, streetlights, and flashlights.

Since LEDs gradually become mainstream light sources, improving properties of LEDs becomes an important issue, and this becomes the main goal in the R&D departments of the LED industries.

SUMMARY

According to an embodiment of the present disclosure, an LED lighting device includes a substrate, an isolation layer, a first bottom electrode, a second bottom electrode, at least one first vertical LED, a first conductive bonding layer, at least one second vertical LED, a second conductive bonding layer, a first transparent sealing material, a second transparent sealing material, and a top electrode. The substrate has a top surface, a base portion, and a plurality of protruding portions present on the base portion. The base portion and the protruding portions cooperate to define at least one first recess and at least one second recess. The base portion and the protruding portions are made of one piece of material. At least one of the first recess and the second recess has a bottom surface and at least one sidewall adjacent to the bottom surface. The bottom surface and the sidewall are reflective. The isolation layer at least covers the first recess and the second recess. The first bottom electrode is disposed in the first recess and on the isolation layer. The second bottom electrode is disposed in the second recess and on the isolation layer. The first vertical LED is disposed in the first recess and has a top surface. The height of the top surface of the first vertical LED is lower than the height of the top surface of the substrate. The first conductive bonding layer bonds the first vertical LED onto the first bottom electrode. The second vertical LED is disposed in the second recess. The second conductive bonding layer bonds the second vertical LED onto the second bottom electrode. The first transparent sealing material is disposed in the first recess. The first transparent sealing material has at least one opening therein to expose at least a part of the first vertical LED. The second transparent sealing material is disposed in the second recess. The second transparent sealing material has at least one opening therein to expose at least a part of the second vertical LED. The top electrode electrically connects the first vertical LED and the second bottom electrode, such that the first vertical LED and the second vertical LED are electrically connected in series.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
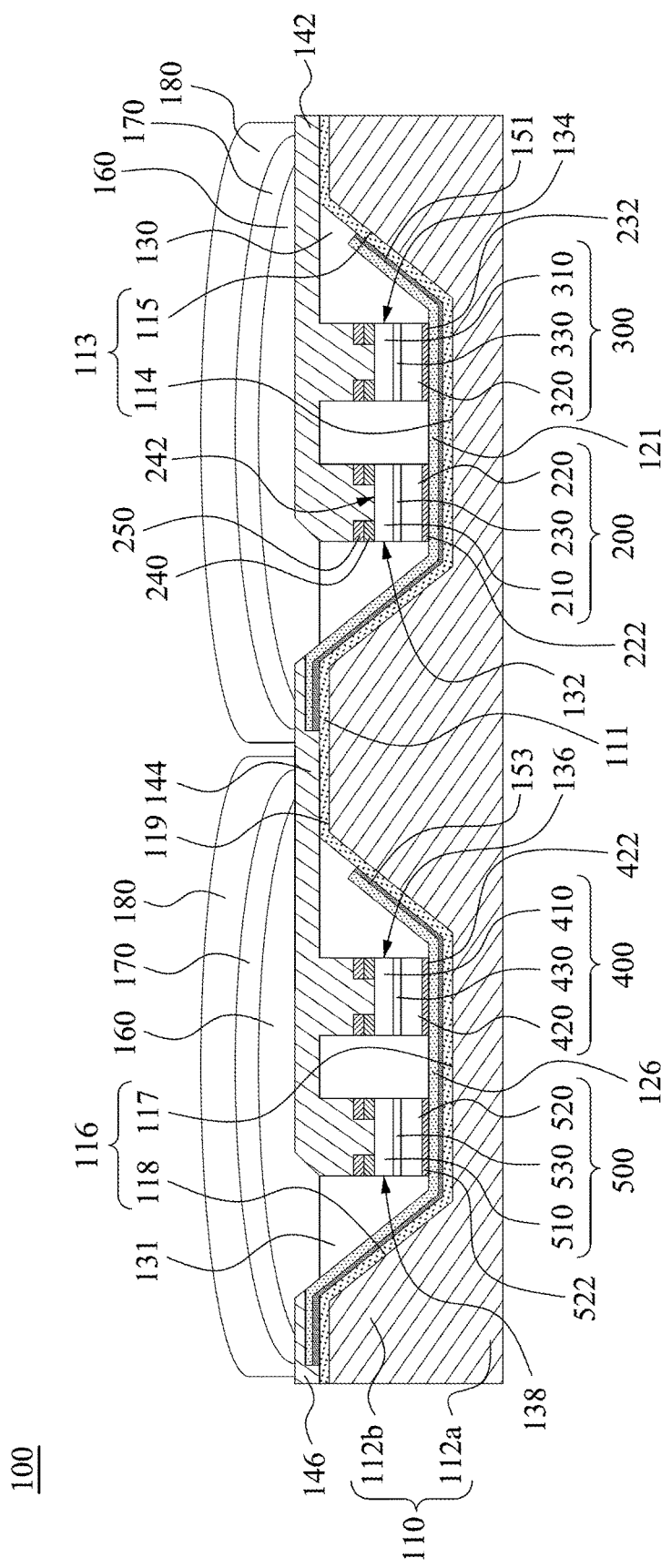
FIG. 1 is a schematic cross-sectional view of a light-emitting diode (LED) lighting device according to some embodiments of the present disclosure.

FIG. 1 is a schematic cross-sectional view of a light-emitting diode (LED) lighting device 100 according to some embodiments of the present disclosure. As shown in FIG. 1, the LED lighting device 100 includes a substrate 110, an isolation layer 111, bottom electrodes 121, 126, at least one vertical LED 200, at least one vertical LED 400, conductive bonding layers 222, 422, transparent sealing materials 130, 131, and a top electrode 144. The substrate 110 has a base portion 112a and a plurality of protruding portions 112b present on the base portion 112a. The base portion 112a and the protruding portions 112b cooperate to define at least one recess 113 and at least one recess 116. The base portion 112a and the protruding portions 112b are made of one piece of material. In other words, the portion 112a and the protruding portions 112b are integrally formed as a single piece. The recess 113 has a bottom surface 114 and at least one sidewall 115 adjacent to the bottom surface 114, and the recess 116 has a bottom surface 117 and at least one sidewall 118 adjacent to the bottom surface 117. The bottom surface 114 and the sidewall 115 of the recess 113 and the bottom surface 117 and the sidewall 118 of the recess 116 are reflective. In some embodiments, the base portion 112a and the protruding portions 112b are also reflective. The substrate 110 may be made of metal capable of reflecting light, such as silver or aluminum or metal alloy, but various embodiments of the present disclosure are not limited in this regard. As a result of such a configuration, light emitted from the vertical LEDs 200, 400 may be reflected by the bottom surface 114 and the sidewall 115 of the recess 113 and the bottom surface 117 and the sidewall 118 of the recess 116, such that the light emitted from the vertical LEDs 200, 400 forwards upwardly. Through the reflective bottom surface 114, the reflective sidewall 115, the reflective bottom surface 117, and the reflective sidewall 118, light emitted from the vertical LEDs 200, 400 may be ensured to forward upwardly and does not forward in an unwanted direction.

In some embodiments, the substrate 110 may be made of a material having a good thermal conductivity. As a result, the substrate 110 may provide a heat dissipation path for dissipating heat that is generated by the vertical LEDs 200, 400, thereby reducing the working temperature of each of the vertical LEDs 200, 400.

Since the substrate 110 is made of metal, the isolation layer 111 may be formed on the substrate 110 to prevent electronic components above the substrate 110 from electrically contacting the metal substrate 110. The isolation layer 111 at least covers the recess 113 and the second recess 116. The bottom electrode 121 is disposed in the recess 113 and on the isolation layer 111. The bottom electrode 126 is disposed in the recess 116 and on the isolation layer 111. The vertical LED 200 is disposed in the recess 113. The conductive bonding layer 222 bonds the vertical LED 200 onto the bottom electrode 121. The vertical LED 400 is disposed in the recess 116. The conductive bonding layer 422 bonds the vertical LED 400 onto the bottom electrode 126. The transparent sealing material 130 is disposed in the recess 113 and surrounds the vertical LED 200. The transparent sealing material 130 has at least one opening 132 therein to expose at least a part of the vertical LED 200. The transparent sealing material 131 is disposed in the recess 116 and surrounds the vertical LED 400. The transparent sealing material 131 has at least one opening 136 therein to expose at least a part of the vertical LED 400. The top electrode 144 electrically connects the vertical LED 400 and the bottom electrode 121, such that the vertical LED 200 and the vertical LED 400 are electrically connected in series.

As a result of such a configuration, the LED lighting device 100 may achieve high power and high luminous efficiency by electrically connecting to a power supply with high voltage. In addition, the current passing the vertical LEDs 200, 400 dose not need to be large to achieve high power and high luminous efficiency. Therefore, the lifetime of the vertical LEDs 200, 400 may be extended, and the working temperatures of the vertical LEDs 200, 400 may be reduced.

For example, if the voltage difference of each of the vertical LEDs 200 and 400 is 3.125 volts, and the current passing through the vertical LEDs 200 and 400 is 1 ampere, the power of the combination of the vertical LEDs 200 and 400 is 6.25 watts. If a single LED is used to achieve the same power, the current should be 2 amperes. As a result, the single LED may have a shorter lifetime due to the larger passing current, and the cooling of the single LED may also be more difficult.

Furthermore, since the LED lighting device 100 utilizes the top electrode 144 to interconnect the vertical LED 400 and bottom electrode 121, a wire bonding process is unneeded. Therefore, the process yield of the LED lighting device 100 may be improved, and the manufacturing cost of the LED lighting device 100 may be reduced.

In some embodiments, the depth of each of the recesses 113, 116 may be in a range from about 5 μm to about 50 μm. The angle between the bottom surface 114 and the sidewall 115 may be in a range from about 120° to about 160°, and the angle between the bottom surface 117 and the sidewall 118 may be in a range from about 120° to about 160°. However, various embodiments of the present disclosure are not limited to the aforesaid depths and angles.

The bottom electrodes 121, 126 may be translucent or transparent, such that light reflected by the bottom surface 114 and the sidewall 115 of the recess 113 and the bottom surface 117 and the sidewall 118 of the recess 116 may pass through the bottom electrodes 121, 126. The bottom electrodes 121, 126 may be made of indium tin oxide (ITO), but various embodiments of the present disclosure are not limited in this regard.

In some embodiments, the bottom electrodes 121, 126 may be made of metal, such as silver. Alternatively, the bottom electrodes 121, 126 may be multi-layer structures. For example, the bottom electrodes 121, 126 are double-layer structures made of copper and silver or triple-layer structures made of copper, titanium, and silver. As a result of such a configuration, the bottom electrodes 121, 126 may be reflective for reflecting light that is emitted from the vertical LEDs 200, 400, such that light emitted from the vertical LEDs 200, 400 may forward upwardly.

When the bottom electrodes 121, 126 are made of metal, the LED lighting device 100 may further include bonding layers 151, 153. The bonding layer 151 is disposed between the bottom electrode 121 and the substrate 110, and the bonding layer 153 is disposed between the bottom electrode 126 and the substrate 110. The bonding layers 151 may increase the adhesion between the bottom electrode 121 and the substrate 110, and the bonding layer 153 may increase the adhesion between the bottom electrode 126 and the substrate 110. In some embodiments, the bonding layers 151, 153 may be made of titanium (Ti), but various embodiments of the present disclosure are not limited in this regard.

The vertical LEDs 200, 400 are in the same electricity polarity. Specifically, the vertical LED 200 includes a first semiconductor layer 210 that is distal to the bottom electrode 121 and a second semiconductor layer 220 that is present adjacent to the bottom electrode 121. The vertical LED 400 includes a first semiconductor layer 410 that is present adjacent to the top electrode 144 and a second semiconductor layer 420 that is present adjacent to the bottom electrode 126. The first semiconductor layers 210, 410 of the vertical LEDs 200, 400 are of the same type, and the second semiconductor layers 220, 420 of the vertical LEDs 200, 400 are of the same type.

In addition, the first semiconductor layers 210, 410 of the vertical LEDs 200, 400 may be n-type semiconductor layers, and the second semiconductor layers 220, 420 of the vertical LEDs 200, 400 may be p-type semiconductor layers. However, various embodiments of the present disclosure are not limited in this regard. In some embodiments, the first semiconductor layers 210, 410 of the vertical LEDs 200, 400 may be p-type semiconductor layers, and the second semiconductor layers 220, 420 of the vertical LEDs 200, 400 may be n-type semiconductor layers.

The first semiconductor layers 210, 410 and the second semiconductor layers 220, 420 may be made of gallium nitride (GaN), but various embodiments of the present disclosure are not limited in this regard. The vertical LED 200 further includes an active layer 230 disposed between the first semiconductor layer 210 and the second semiconductor layer 220. The vertical LED 400 further includes an active layer 430 disposed between the first semiconductor layer 410 and the second semiconductor layer 420. Specifically, the active layer 230, 430 can be multiple-quantum-well structures.

Moreover, the transparent sealing material 130, 131 are used to respectively package the vertical LEDs 200, 400. The transparent sealing material 130, 131 may be made of plastic, organic material, or inorganic material. In addition, the transparent sealing materials 130, 131 have a high refractive index. Specifically, the refractive index of the transparent sealing materials 130, 131 is greater than 1.5. The transparent sealing materials 130, 131 may reduce total reflection in the vertical LEDs 200, 400 and thus enhance the light extraction of the vertical LEDs 200, 400.

In some embodiments, the LED lighting device 100 further includes vertical LEDs 300, 500 and a top electrode 142. The vertical LED 300 is disposed in the recess 113 and on the bottom electrode 121. The vertical LED 500 is disposed in the recess 116 and on the bottom electrode 126. The transparent sealing material 130 has an opening 134 therein to expose at least a part of the vertical LED 300. The transparent sealing material 131 has an opening 138 therein to expose at least a part of the vertical LED 500. The top electrode 144 is further electrically connected to the vertical LED 500 through the opening 138, and the top electrode 142 is electrically connected to the vertical LEDs 200, 300 through the openings 132, 134. The bottom electrode 121 and the top electrode 142 cooperate to electrically connect the vertical LEDs 200, 300 in parallel. The bottom electrode 126 and the top electrodes 144 cooperate to electrically connect the vertical LEDs 400, 500 in parallel.

In some embodiments, the top electrodes 142, 144 may be translucent or transparent. The top electrodes 142, 144 may be made of indium tin oxide (ITO), but embodiments of the present disclosure are not limited thereto. The top electrodes 142, 144 may be patterned from a transparent conductive layer. The patterning of top electrodes 142, 144 may be performed by developing and etching process, or by screen printing and etching process.

In addition, the vertical LEDs 200, 300, 400, 500 are in the same electricity polarity. Specifically, the vertical LED 300 includes a first semiconductor layer 310 present adjacent to the top electrode 142 and a second semiconductor layer 320 present adjacent to the bottom electrode 121. The vertical LED 500 includes a first semiconductor layer 510 present adjacent to the top electrode 144 and a second semiconductor layer 520 present adjacent to the bottom electrode 126. The first semiconductor layers 210, 310, 410, 510 of the vertical LEDs 200, 300, 400, 500 are of the same type, and the second semiconductor layers 220, 320, 420, 520 of the vertical LEDs 200, 300, 400, 500 are of the same type.

Moreover, the vertical LED 200 further includes a patterned dielectric layer 240 that is disposed between a top surface of the vertical LED 200 and the top electrode 142 and covers an edge portion of the top surface of the vertical LED 200. In other words, the patterned dielectric layer 240 is disposed between the first semiconductor layer 210 and the top electrode 142. The patterned dielectric layer 240 covers an edge portion of the first semiconductor layer 210 and has an opening 242. The top electrode 142 is electrically connected to the vertical LED 200 through the opening 242. The patterned dielectric layer 240 may be used to prevent the surface recombination of the vertical LED 200 and to prevent the leakage of the current through the side surface of the vertical LED 200, thereby enhancing the luminous efficiency of the vertical LED 200. In some embodiments, the material of the patterned dielectric layer 240 is silicon nitride (SiNx) or silicon dioxide (SiO$_2$). The patterning of the patterned dielectric layer 240 may be performed by developing and etching process, or by screen printing and etching process.

The vertical LED 200 may further include a guard ring 250 that is disposed on the patterned dielectric layer 240. The guard ring 250 may be used to prevent electrostatic discharge (ESD) and to make the current in the top electrode 142 spread and evenly enter the vertical LED 200. In some embodiments, the guard ring 250 may be made of metal, such as silver. The patterning of the guard ring 250 may be performed by developing and etching process, or by screen printing and etching process. If the shapes of the horizontal cross-sections of the patterned dielectric layer 240 and the guard ring 250 are the same, the patterning of the guard ring 250 may be used as the mask of the patterned dielectric layer 240.

In some embodiments, as shown in FIG. 1, the patterned dielectric layer 240 and the guard ring 250 may be disposed on each of the vertical LEDs 200, 300, 400, 500.

The substrate 110 further has a top surface 119 between the recess 113 and the recess 116, and a part of the bottom electrode 121 is disposed on the top surface 119. The transparent sealing material 130 covers the bottom electrode 121 and exposes the part of the bottom electrode 121 that is disposed on the top surface 119. Therefore, the top electrode 144 and the bottom electrode 121 may make an electrical contact with each other on the top surface 119, such that the part of the bottom electrode 121 disposed on the top surface 191 functions as an auxiliary electrode of the top electrode 144. The auxiliary electrode may enhance the conductivity of the top electrode 144. In addition, the bottom electrode 121 is electrically isolated from the top electrode 142 by the transparent sealing material 130.

In some embodiments, the vertical LEDs 200, 300, 400, 500 have top surfaces, and the heights of the top surfaces of the vertical LEDs 200, 300, 400, and 500 are lower than the height of the top surface 119 of the substrate 110. Therefore, lateral light emitted from the vertical LEDs 200, 300, 400, and 500 is reflected by the bottom surface 114 and the sidewall 115 of the recess 113, the bottom surface 117 and the sidewall 118 of the recess 116, the bottom electrodes 121 and 126.

As shown in FIG. 1, the number of the vertical LEDs in the recess 113 and the number of the vertical LEDs in the recess 116 are the same, but embodiments of the present disclosure are not limited thereto. In some embodiments, the number of the vertical LEDs in the recess 113 and the number of the vertical LEDs in the recess 116 are different. For example, the LED lighting device 100 does not include the vertical LED 300. In some embodiments, the LED lighting device 100 further includes at least one additional vertical LED in the recess 113.

The LED lighting device 100 further includes at least one top isolation layer 160 that covers at least one of the recesses 113 and 116 and at least one of the vertical LEDs 200, 300, 400, 500. The top isolation layer 160 has a high refractive index. Specifically, the refractive index of the top isolation layer 160 is greater than 1.5. The refractive index of the transparent sealing materials 130, 131 is greater than or equal to the refractive index of top isolation layer 160. The top isolation layer 160 may reduce total reflection in the LED light device 100 and thus enhance the light extraction of the vertical LEDs 200, 300, 400, and 500. In some embodiments, a part of the top isolation layer 160 covers the recess 113 and the vertical LEDs 200, 300, and another part of top isolation layer 160 covers the recess 116 and the vertical LEDs 400, 500.

In some embodiments, the number of the top isolation layers 160 is at least two, and the top isolation layers 160 may be stacked. The refractive indices of the top isolation layers 160 increase toward the vertical LEDs 200, 300 or the vertical LEDs 400, 500, and the number of the top isolation layers 160 is up to 5. The material of the top isolation layer 160 may be the same as the material of the transparent sealing material 130, but various embodiments of the present disclosure are not limited in this regard.

The LED lighting device 100 may further include a phosphor layer 170 that is disposed on the top isolation layer 160 and covers at least one of the recesses 113, 116 and at least one of the vertical LEDs 200, 300, 400, 500. In some embodiments, a part of the phosphor layer 170 covers the recess 113 and the vertical LEDs 200, 300, and another part of the phosphor layer 170 covers the recess 116 and the vertical LEDs 400, 500. The refractive index of each of the transparent sealing materials 130, 131 is greater than or equal to the refractive index of the phosphor layer 170, and the refractive index of the top isolation layer 160 is greater than or equal to the refractive index of the phosphor layer 170.

The top isolation layer 160 is disposed between the phosphor layer 170 and each of the transparent sealing materials 130, 131. The top isolation layer 160 may be shaped to allow optical path lengths from at least one of the vertical LEDs 200, 300, 400, 500 through different portions of the phosphor layer 170 to be substantially the same. In some embodiments, the top isolation layer 160 may be substantially dome shaped. Therefore, the color of the light passing the phosphor layer 170 may be even. In addition, the situation that the color of some of the light passing the phosphor layer 170 is yellowish and the color of the other of the light passing the phosphor layer 170 is bluish may be avoided.

Furthermore, the LED lighting device 100 further includes an encapsulation layer 180 that is disposed on the phosphor layer 170. The encapsulation layer 180 covers at least one of the recesses 113 and 116 and at least one of the vertical LEDs 200, 300, 400, 500. In some embodiments, a part of the encapsulation layer 180 covers the recess 113 and the vertical LEDs 200, 300, and another part of the encapsulation layer 180 covers the recess 116 and the vertical LEDs 400, 500.

It is to be noted that the connection relationships and materials of the elements described above will not be repeated. In the following description, other types of LED lighting devices will be described.

Figure 2:
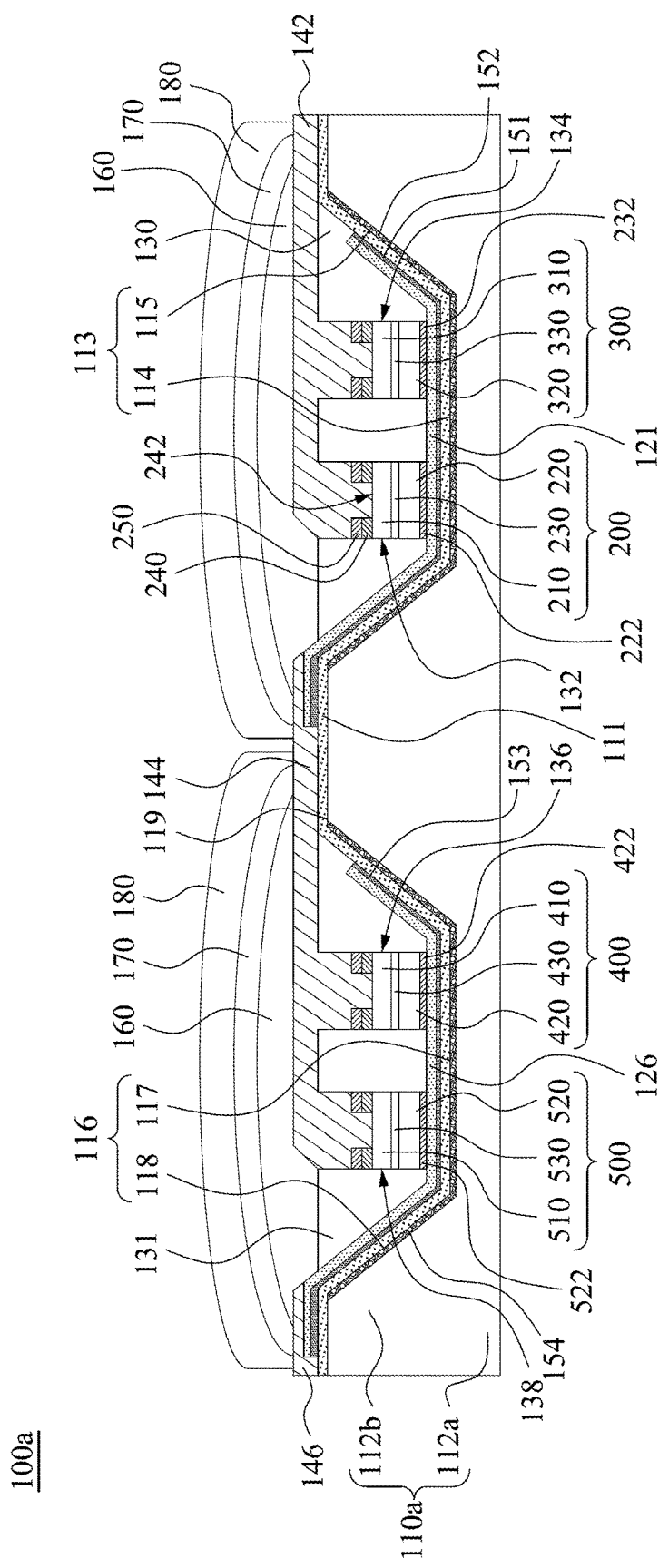
FIG. 2 is a schematic cross-sectional view of an LED lighting device according to some embodiments of the present disclosure.

FIG. 2 is a schematic cross-sectional view of an LED lighting device 100a according to some embodiments of the present disclosure. The LED lighting device 100a includes a substrate 110a, the isolation layer 111, the bottom electrodes 121, 126, the vertical LEDs 200, 300, 400, 500, the conductive bonding layers 222, 422, the transparent sealing materials 130, 131, and the top electrode 144. In some embodiments, the LED lighting device 100a further includes reflective layers 152, 154, and the substrate 110a is made of nonmetal. The reflective layers 152 is disposed on at least one surface of the base portion 112a and at least one surface of the protruding portions 112b to form the reflective bottom surface 114 and the reflective sidewall 115 of the recess 113. The reflective layers 154 is disposed on at least one surface of the base portion 112a and at least one surface of the protruding portions 112b to form the reflective bottom surface 117 and the reflective sidewall 118 of the recess 116.

As a result of such a configuration, light emitted from the vertical LEDs 200, 300 may be reflected by the bottom surface 114 and the sidewall 115 of the recess 113, and light emitted from the vertical LEDs 400, 500 may be reflected by the bottom surface 117 and the sidewall 118 of the recess 116, such that the light emitted from the vertical LEDs 200, 300, 400, 500 forwards upwardly.

After the recesses 113, 116 of the substrate 110a are formed, the reflective layers 152, 154 may be respectively formed on the surfaces of the recesses 113, 116. Therefore, the recesses 113, 116 of the substrate 110a on which the reflective layers 152, 154 are disposed may function to reflect light.

The substrate 110a may be made of ceramic, plastic, or silicon (e.g., undoped silicon, p-type silicon, or n-type silicon), and the substrate 110a may have a high thermal conductivity to dissipate heat that is generated by the vertical LEDs 200, 300, 400, 500. When the substrate 110a is made of silicon, the potential of the substrate 110a may be operated to be the lowest among all elements of the LED lighting device 100a, such that the contact surface of the substrate 110a and the conductive elements above the substrate 110a (e.g., the bottom electrode 121 or the top electrode 144) totally or partially form a reverse bias of the p-n junction. Therefore, the substrate 110a is electrically insulated from the conductive elements above the substrate 110a. In addition, if the substrate 110 is made of silicon, the recess 113 may be formed by a wet etching process, and the angle between the bottom surface 114 and the tapered sidewall 115 of the recess 113 is about 125.3°.

Figure 3A:
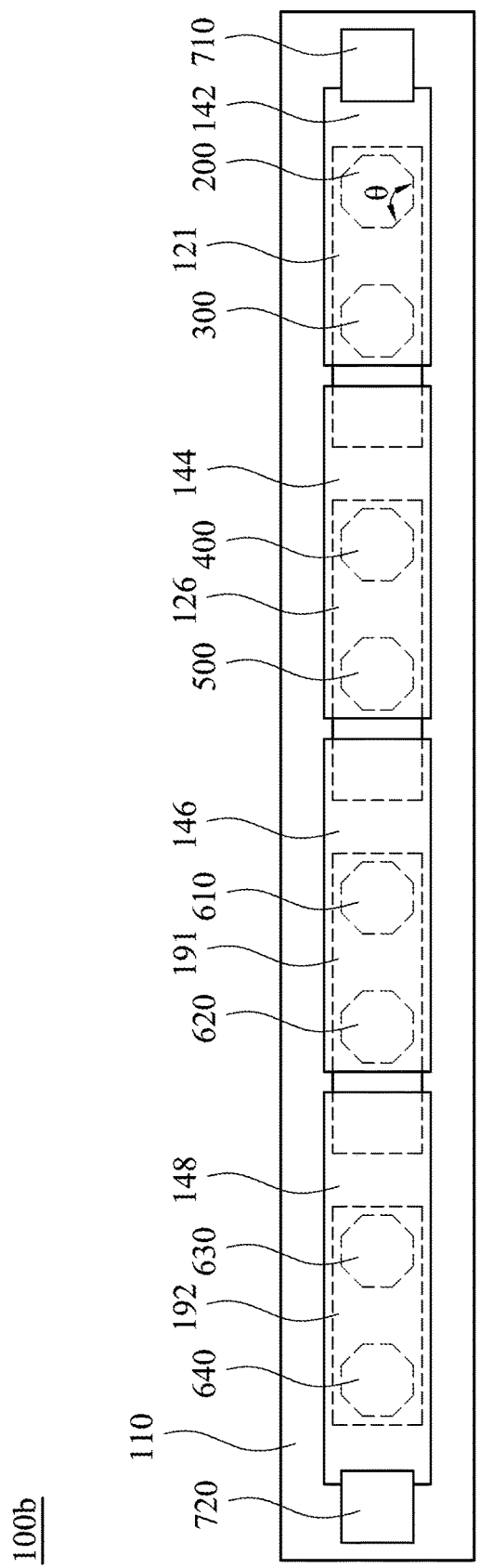
FIG. 3A is a schematic top view of an LED lighting device according to some embodiments of the present disclosure.

FIG. 3A is a schematic top view of an LED lighting device 100b according to some embodiments of the present disclosure. The LED light device 100b includes the LED lighting device 100 shown in FIG. 1 or the LED lighting device 100a shown in FIG. 2. The LED light device 100b further includes bottom electrodes 191, 192, top electrodes 146, 148, and vertical LEDs 610, 620, 630, 640. The vertical LEDs 200, 300, 400, 500, 610, 620, 630, 640 are electrically connected to each other via the bottom electrodes 121, 126, 191, 192 and the top electrodes 142, 144, 146, 148. The vertical LEDs 610, 620 are electrically connected in parallel via the bottom electrode 191 and the top electrode 146. The vertical LEDs 630, 640 are electrically connected in parallel via the bottom electrode 192 and the top transparent electrode 148.

The shape of each of the top surfaces of the vertical LEDs 200, 300, 400, 500, 610, 620, 630, 640 may be a polygon, and each of the angles of the polygon may be an obtuse angle θ. In some embodiments, the shape of each of the top surfaces of the vertical LEDs 200, 300, 400, 500, 610, 620, 630, 640 is an octagon, but embodiments of the present disclosure are not limited thereto.

The LED lighting device 100b further includes an input electrode 710 and an output electrode 720 respectively electrically connected to the top electrodes 142, 148 for allowing a power supply to be electrically connected thereto. The input electrode 710 and the output electrode 720 are single-layer structures or multi-layer structures, and the input electrode 710 and the output electrode 720 are made of conductive materials. For example, the input electrode 710 and the output electrode 720 are single-layer structures made of silver, double-layer structures made of copper and silver, or triple-layer structures made of copper, titanium, and silver. In addition, the input electrode 710, the output electrode 720, and the bottom electrodes 121, 126, 191, 192 may be formed in the same process.

In some embodiments, the bottom electrodes 121, 126, 191, 192, the top electrodes 142, 144, 146, 148, and vertical LEDs 200, 300, 400, 500, 610, 620, 630, 640 are disposed in a line, but embodiments of the present disclosure are not limited thereto. The shape of the substrate 110 may be a cylindrical column, a triangular prism, a cube, a cuboid, a hexagonal column, an octagonal column, or a polygon column.

Figure 3B:
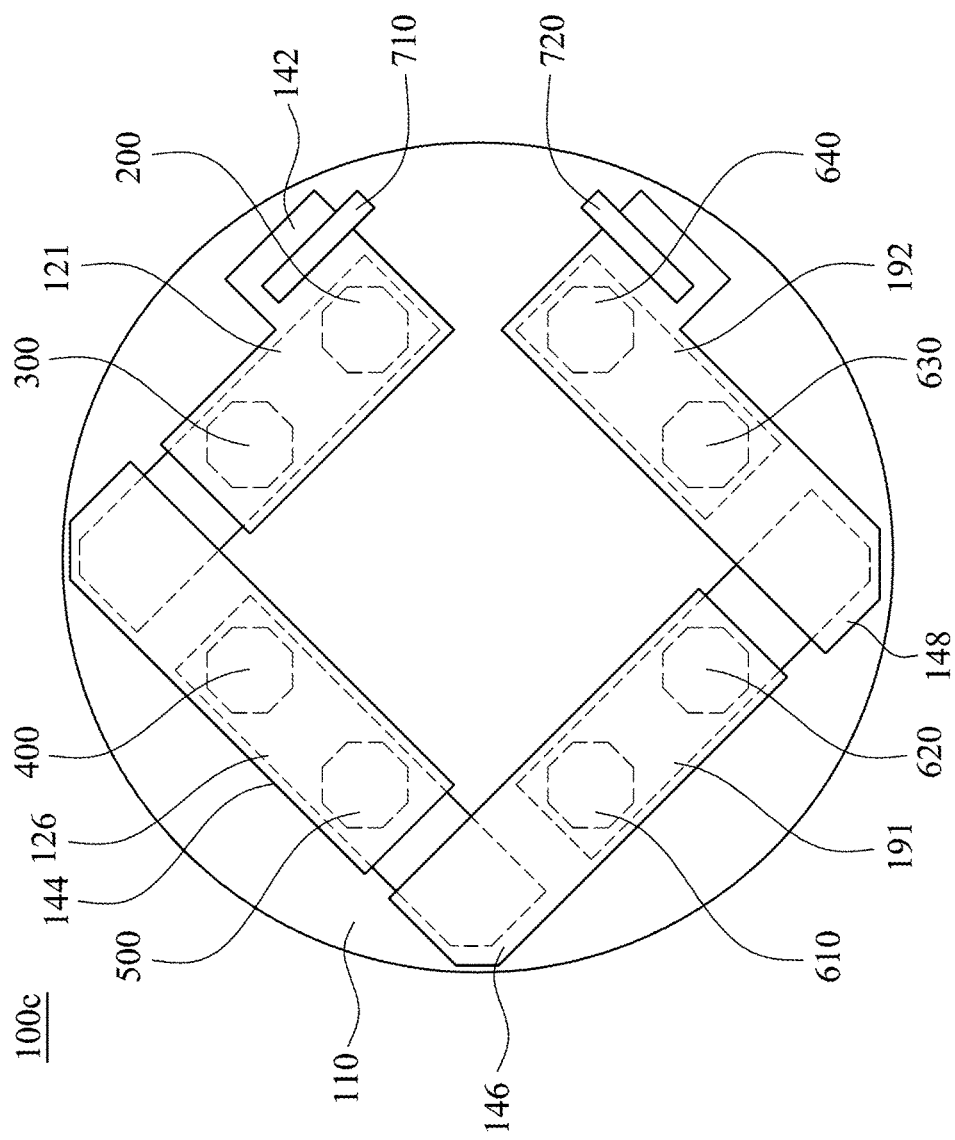
FIG. 3B is a schematic top view of an LED lighting device according to some embodiments of the present disclosure.

FIG. 3B is a schematic top view of an LED lighting device 100c according to some embodiments of the present disclosure. As shown in FIG. 3B, the shape of the substrate 110 is a cylindrical column, and the bottom electrodes 121, 126, 191, 192, the top electrodes 142, 144, 146, 148, and vertical LEDs 200, 300, 400, 500, 610, 620, 630, 640 are disposed in a ring.

In addition, the shape of each of the bottom electrode 121, 126, 191, and 192 may be a cylindrical column, a cube, a cuboid, a dumbbell-shaped column, or a polygon column. The shape of each of the LEDs 200, 300, 400, 500, 610, 620, 630, and 640 may be a cylindrical column, a cube, a cuboid, a hexagonal column, an octagonal column, or a polygon column. The shape of each of the top electrodes 142, 144, 146, and 148 may be a cylindrical column, a cube, a cuboid, a hexagonal column, an octagonal column, or a polygon column. The shape of each of the input electrode 710 and the output electrode 720 may be a cylindrical column, a cube, a cuboid, a hexagonal column, an octagonal column, or a polygon column.

Figure 4:
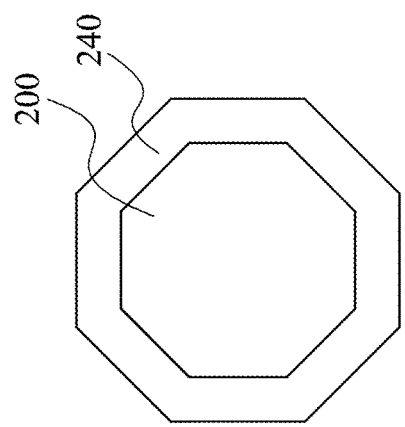
FIG. 4 is a horizontal cross-sectional view of a patterned dielectric layer according to some embodiments of the present disclosure.

FIG. 4 is a horizontal cross-sectional view of the patterned dielectric layer 240 according to some embodiments of the present disclosure. The patterned dielectric layer 240 is disposed on the vertical LED 200, and the shape of the horizontal cross-section of the patterned dielectric layer 240 may be a ring on the edge portion of the top surface of the vertical LED 200. In some embodiments, the shape of the horizontal cross-section of the patterned dielectric layer 240 may be a ring with a cross, or a plurality of rings with a cross. As shown in FIG. 1, the shape of the horizontal cross-section of guard ring 250 may be similar to that of the patterned dielectric layer 240, and the vertical LEDs 300, 400, 500 may also have the patterned dielectric layer 240 and the guard ring 250.

Figure 5:
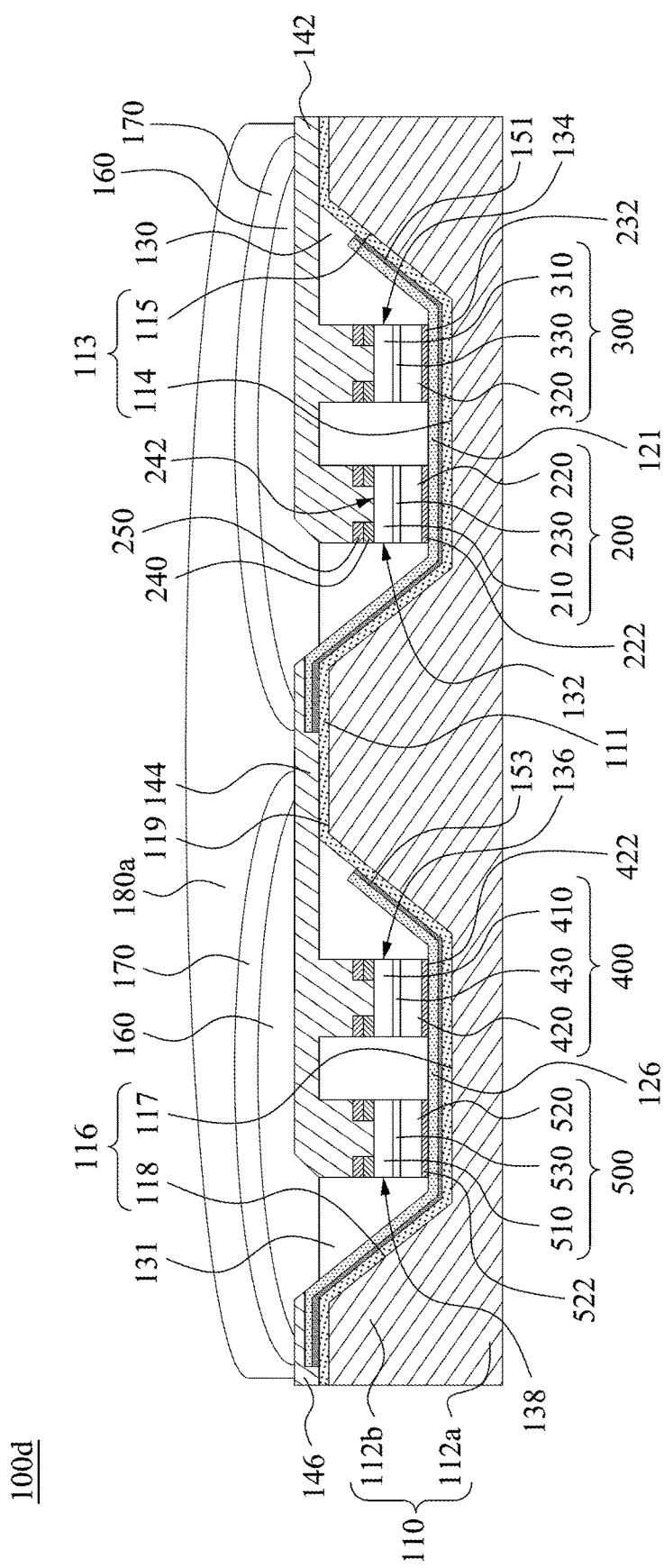
FIG. 5 is a schematic cross-sectional view of an LED lighting device according to some embodiments of the present disclosure.

FIG. 5 is a schematic cross-sectional view of an LED lighting device 100d according to some embodiments of the present disclosure. The difference between this embodiment and the embodiment show in FIG. 1 is that an encapsulation layer 180a integrally covers the recesses 113, 116 and the vertical LEDs 200, 300, 400, 500.

Figure 6:
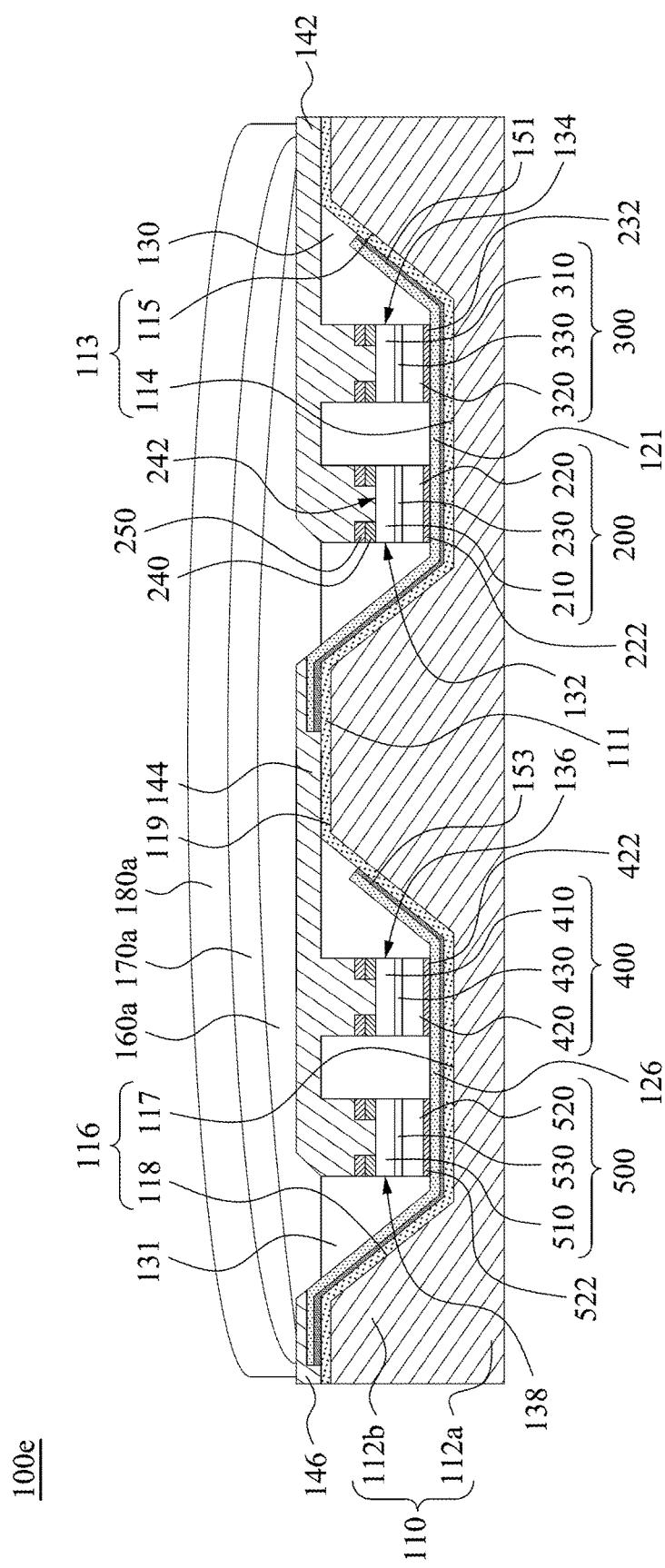
FIG. 6 is a schematic cross-sectional view of an LED lighting device according to some embodiments of the present disclosure.

FIG. 6 is a schematic cross-sectional view of an LED lighting device 100e according to some embodiments of the present disclosure. The difference between this embodiment and the embodiment show in FIG. 5 is that a top isolation layer 160a integrally covers the recesses 113 and 116 and the vertical LEDs 200, 300, 400, 500, and an phosphor layer 170a integrally covers the recesses 113, 116 and the vertical LEDs 200, 300, 400, 500.

Figure 7:
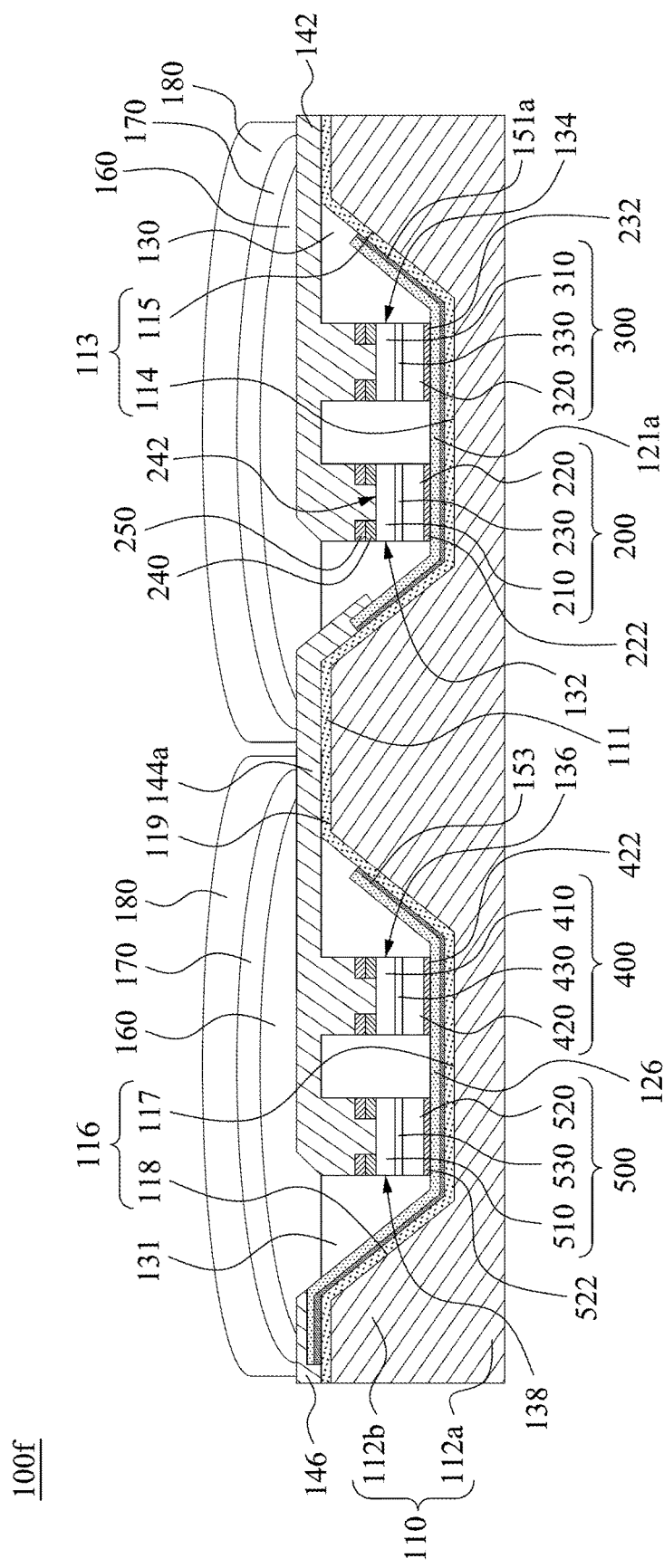
FIG. 7 is a schematic cross-sectional view of an LED lighting device according to some embodiments of the present disclosure.

FIG. 7 is a schematic cross-sectional view of an LED lighting device 100f according to some embodiments of the present disclosure. The difference between this embodiment and the embodiment show in FIG. 1 is that a bottom electrode 121a is not disposed on the top surface 119 of the substrate 110, and a part of a top electrode 144a is disposed on the sidewall 115 of the recess 113. In some embodiments, the top electrode 144a and the bottom electrode 121a make an electrical contact with each other on the sidewall 115 of the recess 113.

Figure 8:
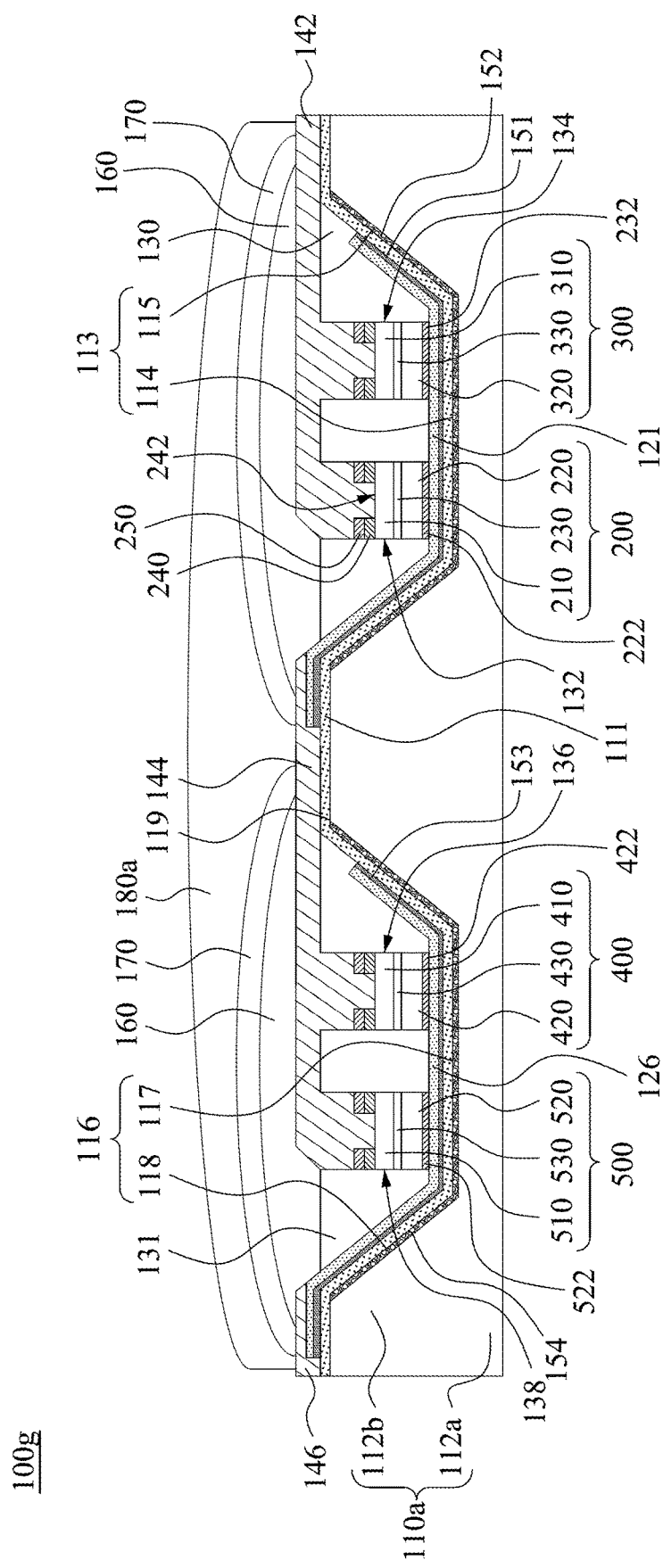
FIG. 8 is a schematic cross-sectional view of an LED lighting device according to some embodiments of the present disclosure.

FIG. 8 is a schematic cross-sectional view of an LED lighting device 100g according to some embodiments of the present disclosure. The difference between this embodiment and the embodiment show in FIG. 2 is that the encapsulation layer 180a integrally covers the recesses 113, 116 and the vertical LEDs 200, 300, 400, 500.

Figure 9:
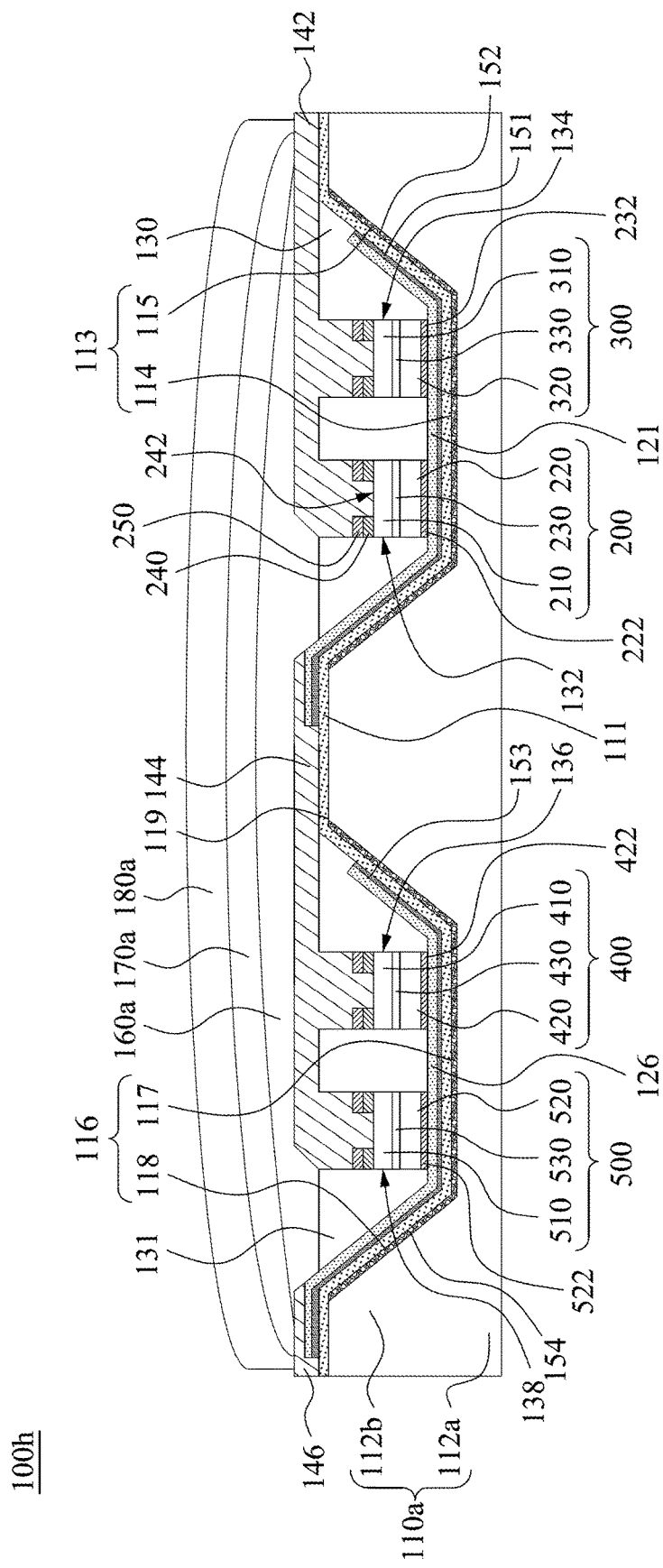
FIG. 9 is a schematic cross-sectional view of an LED lighting device according to some embodiments of the present disclosure.

FIG. 9 is a schematic cross-sectional view of an LED lighting device 100h according to some embodiments of the present disclosure. The difference between this embodiment and the embodiment show in FIG. 8 is that the top isolation layer 160a integrally covers the recesses 113 and 116 and the vertical LEDs 200, 300, 400, 500, and the phosphor layer 170a integrally covers the recesses 113, 116 and the vertical LEDs 200, 300, 400, 500.

Figure 10:
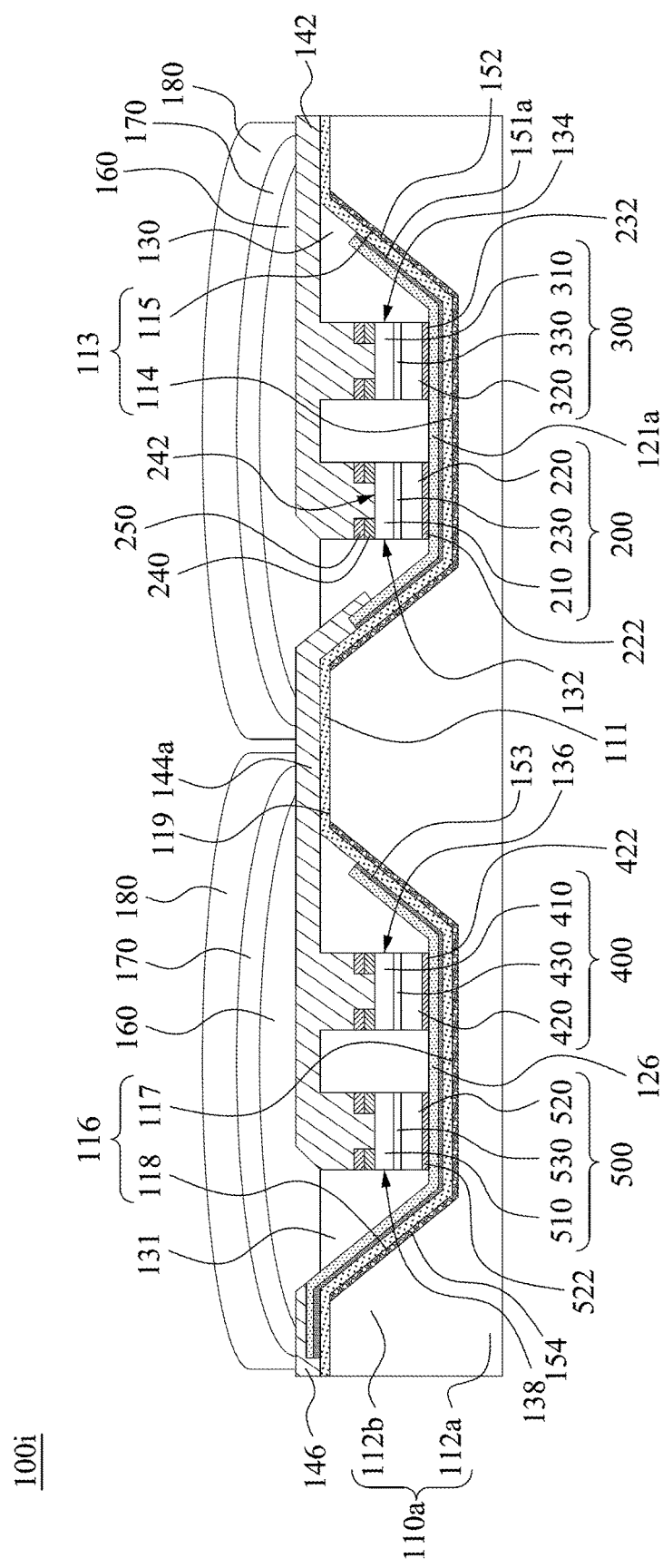
FIG. 10 is a schematic cross-sectional view of an LED lighting device according to some embodiments of the present disclosure.

FIG. 10 is a schematic cross-sectional view of an LED lighting device 100i according to some embodiments of the present disclosure. The difference between this embodiment and the embodiment show in FIG. 2 is that the bottom electrode 121a is not disposed on the top surface 119 of the substrate 110, and a part of the top electrode 144a is disposed on the sidewall 115 of the recess 113. In some embodiments, the top electrode 144a and the bottom electrode 121a make an electrical contact with each other on the sidewall 115 of the recess 113.

The LED lighting device of the present disclosure includes the substrate that has the recesses capable of reflecting light, and all other structures are stacked on the substrate. Therefore, light emitted from the vertical LEDs may be reflected to forward upwardly by the surfaces of the recesses. Moreover, the manufacturing processes of the LED lighting device become easy, and problems such as alignment difficulty may be avoided, such that the process yield is enhanced and the production cost is reduced. In addition, by electrically connecting the vertical LEDs in series, the LED lighting device can achieve high power and high luminous efficiency by electrically connecting to a power supply with high voltage, and the current passing the vertical LEDs does not need to be large to achieve high power and high luminous efficiency. Therefore, the lifetime of the vertical LEDs may be extended, and cooling may not become a problem.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A light-emitting diode (LED) lighting device, comprising:
 a substrate having a top surface, a base portion and a plurality of protruding portions present on the base portion, the base portion and the protruding portions defining at least one first recess and at least one second recess, wherein the base portion and the protruding portions are made of one piece of material, at least one of the first recess and the second recess has a bottom surface and at least one sidewall adjacent to the bottom surface, and the bottom surface and the sidewall are reflective;
 an isolation layer at least covering the first recess and the second recess;
 a first bottom electrode disposed in the first recess and on the isolation layer;
 a second bottom electrode disposed in the second recess and on the isolation layer;
 at least one first vertical LED disposed in the first recess and having a top surface, wherein a height of the top surface of the first vertical LED is lower than a height of the top surface of the substrate;

a first conductive bonding layer bonding the first vertical LED onto the first bottom electrode;

at least one second vertical LED disposed in the second recess;

a second conductive bonding layer bonding the second vertical LED onto the second bottom electrode;

a first transparent sealing material disposed in the first recess, wherein the first transparent sealing material has at least one opening therein to expose at least a part of the first vertical LED;

a second transparent sealing material disposed in the second recess, wherein the second transparent sealing material has at least one opening therein to expose at least a part of the second vertical LED; and a top electrode electrically connecting the first vertical LED and the second bottom electrode, such that the first vertical LED and the second vertical LED are electrically connected in series.

2. The LED lighting device of claim 1, wherein the top electrode is translucent or transparent.

3. The LED lighting device of claim 1, further comprising:

a phosphor layer covering at least one of the first vertical LED and the second vertical LED.

4. The LED lighting device of claim 3, wherein an refractive index of the first transparent sealing material is greater than or equal to an refractive index of the phosphor layer.

5. The LED lighting device of claim 3, wherein optical path lengths from said one of the first vertical LED and the second vertical LED through different portions of the phosphor layer are substantially the same.

6. The LED lighting device of claim 3, further comprising:

at least one top isolation layer disposed between the phosphor layer and the first transparent sealing material, wherein the top isolation layer is shaped to allow optical path lengths from said one of the first vertical LED and the second vertical LED through different portions of the phosphor layer to be substantially the same.

7. The LED lighting device of claim 1, wherein the transparent sealing material is made of organic material.

8. The LED lighting device of claim 1, wherein at least one of the first bottom electrode and the second bottom electrode is reflective.

9. The LED lighting device of claim 1, wherein the top surface of the substrate is located between the first recess and the second recess, and the top electrode and the second bottom electrode make an electrical contact with each other on the top surface of the substrate.

10. The LED lighting device of claim 1, further comprising:

a patterned dielectric layer disposed between the top surface of the first vertical LED and the top electrode and covering an edge portion of the top surface of the first vertical LED.

11. The LED lighting device of claim 10, further comprising:

a guard ring disposed on the patterned dielectric layer.

12. The LED lighting device of claim 1, further comprising:

an encapsulation layer covering one of the first recess and the second recess.

13. The LED lighting device of claim 1, further comprising:

an encapsulation layer covering the first recess and the second recess.

14. The LED lighting device of claim 1, wherein the first bottom electrode is made of metal; and further comprising:

a third bonding layer disposed between the first bottom electrode and the substrate.

15. The LED lighting device of claim 1, wherein a shape of the top surface of the first vertical LED is a polygon, and angles of the polygon are obtuse angles.

16. The LED lighting device of claim 1, wherein the top electrode and the second bottom electrode make an electrical contact with each other on the sidewall.

17. The LED lighting device of claim 1, further comprising a plurality of the first vertical LEDs disposed in the first recess and on the first bottom electrode, wherein the top electrode and the first bottom electrode cooperate to electrically connect the first vertical LEDs in parallel.

18. The LED lighting device of claim 1, wherein the base portion and the protruding portions are reflective.

19. The LED lighting device of claim 1, wherein the substrate comprises:

a reflective layer disposed on at least one surface of the base portion and at least one surface of the protruding portions to form the reflective bottom surface and the reflective sidewall.

* * * * *